United States Patent
Hoefler et al.

(10) Patent No.: US 7,575,958 B2
(45) Date of Patent: Aug. 18, 2009

(54) PROGRAMMABLE FUSE WITH SILICON GERMANIUM

(75) Inventors: Alexander B. Hoefler, Austin, TX (US); Marius K. Orlowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 295 days.

(21) Appl. No.: 11/247,479

(22) Filed: Oct. 11, 2005

(65) Prior Publication Data
US 2007/0082431 A1 Apr. 12, 2007

(51) Int. Cl.
*H01L 21/82* (2006.01)
(52) U.S. Cl. .................. 438/132; 438/487; 438/601; 257/E21.529
(58) Field of Classification Search ............ 438/132, 438/467, 601, FOR. 433; 257/E21.529
See application file for complete search history.

(56) References Cited

U.S. PATENT DOCUMENTS

| | | | |
|---|---|---|---|
| 5,436,496 A | 7/1995 | Jerome et al. | |
| 6,258,700 B1 | 7/2001 | Bohr et al. | |
| 6,911,360 B2 | 6/2005 | Li et al. | |
| 2002/0033519 A1 | 3/2002 | Babcock et al. | |
| 2003/0155592 A1* | 8/2003 | Shima et al. | 257/288 |
| 2006/0108662 A1* | 5/2006 | Kothandaraman et al. | 257/528 |
| 2007/0026579 A1* | 2/2007 | Nowak et al. | 438/149 |
| 2007/0082431 A1* | 4/2007 | Hoefler et al. | 438/128 |

OTHER PUBLICATIONS

International Search Report and Written Opinion.

* cited by examiner

*Primary Examiner*—Jack Chen
*Assistant Examiner*—Matthew Reames
(74) *Attorney, Agent, or Firm*—David G. Dolezal; Robert L. King

(57) ABSTRACT

A programmable fuse and method of formation utilizing a layer of silicon germanium (SiGe) (e.g. monocrystalline) as a thermal insulator to contain heat generated during programming. The programmable fuse, in some examples, may be devoid of any dielectric materials between a conductive layer and a substrate. In one example, the conductive layer serves as programmable material, that in a low impedance state, electrically couples conductive structures. A programming current is applied to the programmable material to modify the programmable material to place the fuse in a high impedance state.

23 Claims, 2 Drawing Sheets

PROGRAMMABLE FUSE WITH SILICON GERMANIUM

BACKGROUND OF THE INVENTION

1. Field of the Invention

This invention relates in general to semiconductor devices and more specifically to fuses for semiconductor devices.

2. Description of the Related Art

Programmable fuses are utilized in semiconductor devices e.g. for chip identification, circuit customization, and memory repair. With some types of fuses, a programming structure electrically couples two conductive structures. To electrically program the fuse, a current is driven between the conductive structures to heat the programming structure wherein the conductive programming structure becomes physically discontinuous or the material of the conductive programming structures becomes discontinuous. Accordingly, for a programmed fuse exhibiting a high impedance state, the two conductive structures have a high resistance or have an open circuit between them.

One problem with electrically programming a fuse is that it is desirable to contain the heat generated from programming to the fuse area of an integrated circuit so as not to damage other portions of the integrated circuit. Also, it is desirable to contain the heat within the region of the programming structure to more efficiently make discontinuous the programming structure, thereby requiring less current to program the structure.

Typically, dielectric structures (e.g. silicon oxide) are used as a thermally insulative material to keep the programming heat from diffusing from other parts of the integrated circuit. However, the formation of these dielectric structures may require extra processing steps.

What is needed is an improved electrically programmable fuse.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The features shown in the Figures are not necessarily drawn to scale.

DETAILED DESCRIPTION

The following sets forth a detailed description of a mode for carrying out the invention. The description is intended to be illustrative of the invention and should not be taken to be limiting.

In one embodiment of an electrically programmable fuse, silicon germanium may be utilized as a thermally insulative material for inhibiting the spread of heat generated from electrically programming the fuse.

Figure 1:
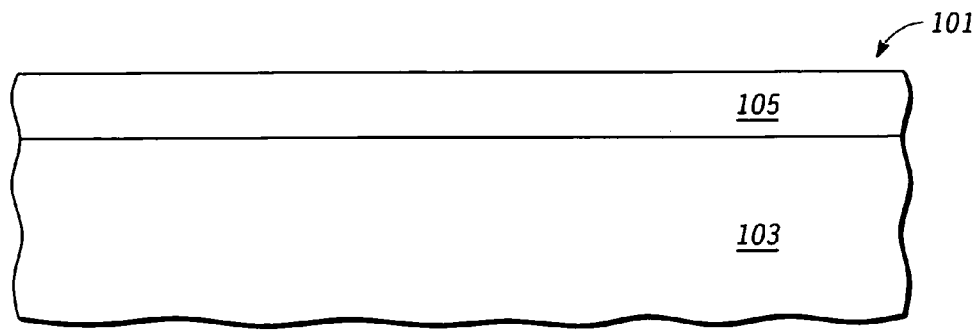
FIG. 1 is a partial side view of a wafer during manufacture of one embodiment of the present invention.

FIG. 1 is a partial side view of a wafer during its manufacture. Wafer 101 includes a substrate of bulk material 103 (e.g. monocrystalline silicon) and a layer of monocrystalline silicon germanium layer 105 located on bulk material 103. In one embodiment, layer 105 is 70 percent silicon and 30 percent of germanium. However, in other embodiments, the ratios of silicon to germanium may be different. For example, other ratios that may be utilized include 60% Si and 40% Ge; 50% Si and 50% Ge; or 30% Si and 70% Ge. In one embodiment, layer 105 includes only silicon and germanium, but in other embodiments, layer 105 may include other materials (e.g. carbon as in silicon germanium carbon, $Si_{1-x-y}Ge_xC_y$) and may include doping materials (e.g. boron, phosphorous, and arsenic).

In one embodiment, silicon germanium layer 105 is formed by implanting germanium ions into bulk material 103. For example, germanium may be implanted at an energy of 500 KeV and at a dose of $5 \times 10^{16}$ cm$^{-2}$. However, implanting parameters may be different in other embodiments. After implantation, thermal annealing may be performed to anneal defects from implantation. In one embodiment, layer 105 is formed by implanting germanium ions in selective areas of bulk material 103.

In another embodiment, silicon germanium layer 105 maybe be formed by epitaxially growing layer 105 on bulk material 103. In one embodiment, layer 105 is approximately 2000 angstroms thick, but may be of other dimensions in other embodiments. For example, in some embodiments, layer 105 may be between 1000 and 3000 angstroms thick.

In another embodiment, silicon germanium layer 105 may be formed by CVD deposition from precursors such as silane (SiH4) germane (GeH4) or disilane (Si2H6) and digermane (Ge3H6). The resulting film may be amorphous or polycrystalline.

In one embodiment, layer 105 is of a conductivity type different than bulk material 103. In one embodiment, layer 105 is doped with an n-type material (e.g. arsenic, phosphorus) and bulk material 103 is doped with a p-type material (e.g. Boron). In other embodiments, the conductivity types may be reversed.

Figure 2:
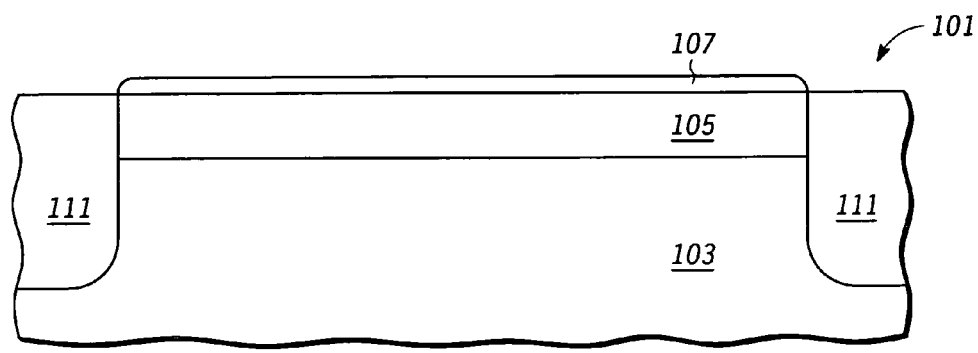
FIG. 2 is another partial side view of a wafer during manufacture of one embodiment of the present invention
Figure 4:
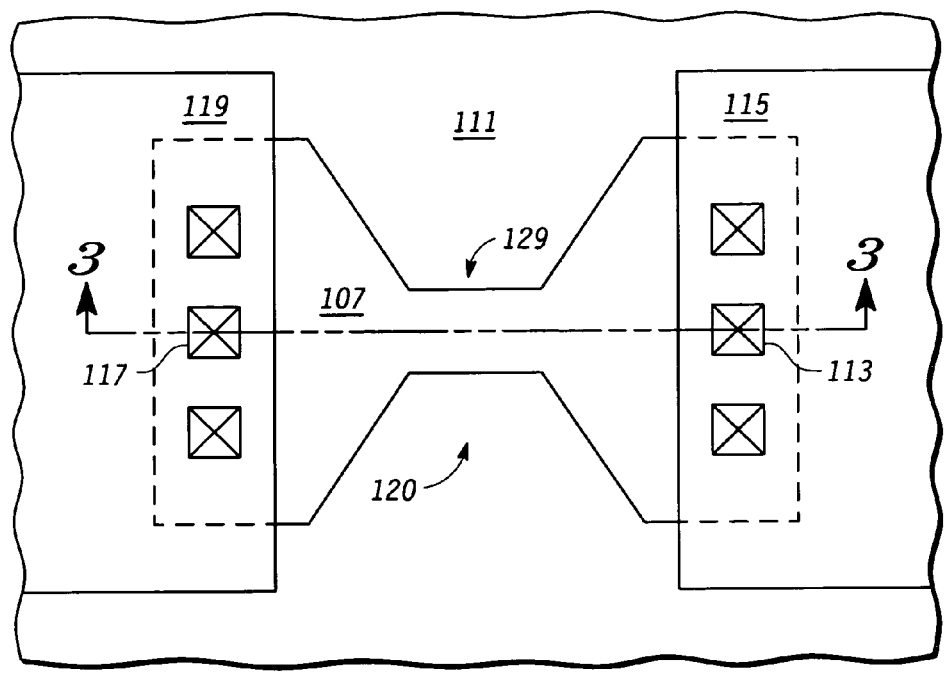
FIG. 4 is top view of a programmable fuse according to one embodiment of the present invention.

FIG. 2 shows another partial side view of wafer 101 after layer 105 has been patterned, trench isolation 111 is formed, and a silicide 107 is formed on the patterned portion of layer 105. In one embodiment, layer 105 is patterned by conventional photolithographic processes. See FIG. 4 showing a top view of one embodiment of the pattern of layer 105 (as shown by the pattern of silicide 107).

Figure 3:
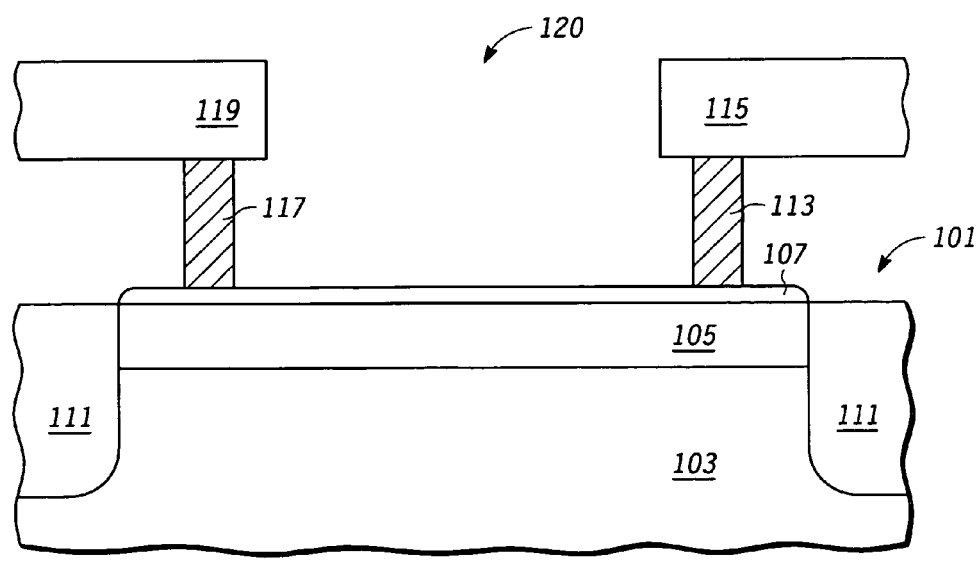
FIG. 3 is a side view of a programmable fuse according to one embodiment of the present invention.

In one example of patterning layer 105, a patterning mask (e.g. photo resist) (not shown) is initially formed on layer 105. Portions of layer 105 not covered by the patterning masked are etched (e.g. anisotropic etch) along with portions of bulk material 103 located below the etched portions of layer 105. After the etching, a dielectric liner (not shown) may be formed on wafer 101 followed by the deposition of a thicker dielectric (e.g. silicon oxide or TEOS). The wafer is then planarized, wherein FIG. 3 shows the remaining portion of the dielectric (trench isolation 111) surrounding silicon germanium layer 105. In other embodiments, trench isolation 111 may be formed by other conventional techniques e.g. local oxidation of silicon.

After the formation of trench isolation 111, silicide 107 is formed on layer 105. In one embodiment, silicide 107 is formed by depositing a metal layer (e.g. cobalt, titanium, tantalum, molybdenum, or nickel) over wafer 101 followed by a heating of wafer 101 to react the metal with exposed semiconductor material. Cleaning or etching processes may follow the heating processes in some embodiments to remove excess metal. In other embodiments, the fuse may include other types of conductive programmable material in place of or in addition to silicide 107.

FIG. 3 shows a partial side view of wafer 101 after the formation of contacts and interconnect metal lines. In the embodiment shown, contacts 117 and 113 are formed in physical and in electrical contact with silicide 107. In embodiment shown, contacts 117 and 113 are formed by depositing a dielectric (not shown) and etching holes (not shown) over silicide 107. A metal for the contacts (e.g. tungsten) is deposited over the wafer including in the holes wherein the wafer is then planarized (e.g. by a CMP processes). Contacts 117 and 113 may include barrier layers (e.g. titanium) in some embodiments. Contacts 117 and 113 may be formed by other conventional techniques and/or may be made of other materials in other embodiments.

In the embodiment shown, metal interconnects 119 and 115 are located in the metal 1 layer. In one embodiment, interconnects 119 and 115 are made from copper, but may be made of other materials (e.g. aluminum, gold) in other embodiments. Interconnects 115 and 119 may be formed in one embodiment by depositing a layer of metal material (not shown), patterning the layer of metal material, and then depositing dielectric material over the patterned layer of metal material. The wafer is then polished to planarize. However, interconnects 115 and 119 may be formed by other conventional techniques in other embodiments. Also, in some embodiments, interconnects 119 and 115 may include barrier layers (not shown).

Not shown in FIG. 3 are dielectric material surrounding contacts 117 and 113 and interconnects 119 and 115.

In subsequent processing steps, additional metal layers (not shown) including interconnects and conductive vias may be formed over metal layer 1. Also, bond pads and passivation layers (not shown) may be formed on wafer 101 over the additional metal layers. Afterwards, the wafer is singulated (e.g. with a saw) to form individual integrated circuit die. The die may be incorporated in integrated circuit packages by conventional techniques and have conventional configurations.

FIG. 4 is a partial top view of wafer 101 showing the features of FIG. 3. FIG. 4 shows a top view of the pattern of layer 105 (e.g. with silicide 107 formed there over) surrounded by trench isolation 111. In the embodiment of FIG. 4, interconnect 119 is electrically coupled to silicide 107 via three contacts in a row with contact 117 located in the middle. Also, interconnect 115 is electrically coupled to silicide 107 via three contacts in a row with contact 113 located in the middle. A first terminal of the fuse includes the three contacts in which contact 117 is the middle contact. A second terminal of the fuse includes the three contacts in which contact 113 is the middle contact.

In FIG. 4, fuse 120 is shown in its low impedance state. Accordingly, interconnect 115 is at relatively the same potential as interconnect 119. To program fuse 120, a voltage is applied to one of the interconnects (119 or 115) to generate a programming current through silicide 107 to the other interconnect. This programming current heats silicide 107 to a point where it causes material discontinuities in silicide 107 at a narrow portion 129 of silicide 107. These discontinuities provide for a high impedance (e.g. a circuit open or relatively high resistance) between interconnect 119 and interconnect 115, thereby placing fuse 120 in a high impedance state.

Referring back to FIG. 3, layer 105 provides thermal insulation to prevent the spread of heat generated by a programming current to bulk material 103. Accordingly, containing the programming heat promotes a more efficient programming of fuse 120 by concentrating the programming heat at silicide 107. In addition, the containment of the heat prevents damage to other structures of the integrated circuit during programming.

In one embodiment, $Si_{1-x}Ge_x$ acts as a thermal insulator due to its relatively lower thermal conductivity than silicon. For example, silicon has a thermal conductivity of 1.3-1.5 watts (W)/(cm-K). Germanium has a thermal conductivity of 0.58 W/(cm-K). Silicon germanium has a thermal conductivity ranging from 0.06-0.10 W/(cm-K) depending upon the germanium mole fraction. Generally, a mole fraction of germanium at 25%-85% provides a minimum thermal conductivity, with a minimum thermal conductivity occurring with germanium around 35%. However, the dependence of SiGe thermal conductivity for Ge content is nearly flat between for $0.35 < x < 0.85$. Outside this interval the conductivity increases rapidly to maxima x=0 (pure Si) and x=1 (pure Ge). Silicon oxide has a thermal conductivity of 0.014 W/(cm-K).

In addition, the interface between SiGe and Si in some embodiments may provide an additional barrier for heat flow, i.e. additional heat insulation. Thus, a relatively thin layer of SiGe on Si has a lower effective thermal conductivity than the heat conductivity of bulk SiGe.

Utilizing silicon germanium as a heat insulator to contain heat from fuse programming may allow for a fuse to be implemented in an integrated circuit whose manufacture is of reduced complexity. For example, with such an arrangement, a dielectric layer may not be needed in some embodiments for thermal insulation between the bulk semiconductor material (103) and the conductive programmable material (e.g. silicide 107). For example, with the embodiments described herein, a semiconductive or conductive material of the fuse need not be formed over a previously formed dialectic. Accordingly, the manufacturing processes may be simplified due to the lack of such insulators.

Furthermore, another advantage that may occur with the embodiments described herein is that the programmable material of a fuse may be formed independent of the gate material and gate oxide of other transistors of the wafer. For example, with the embodiment shown, a fuse may be formed without the utilization of polysilicon gate material. Accordingly, such embodiments may be implemented on integrated circuits that utilize metal gates instead of polysilicon gates.

Referring back to FIG. 3, wafer 101 also includes other structures (not shown) formed laterally to fuse 120 in other areas of wafer 101. Examples of such structures include MOS transistors, diodes, and capacitors. In one embodiment, the active regions (e.g. channel and source/drain regions of a MOS transistor) may be formed in portions of layer 105 located in areas outside of trench isolation 111. In some embodiments, the active portions of a wafer would be selectively implanted with germanium in the areas of the fuse wherein the channel and source/drain regions of the planar transistors would be formed in active regions unimplanted with germanium.

In some embodiments, the processes set forth above for forming fuse 120 may be performed during the formation of other structures of the wafer. For example, trench isolation 111 would be formed during the formation of other trench isolations of wafer 101. Silicide 107 would be formed during the formation of silicide on source/drain regions (and during the formation of gate silicide for polysilicon gates in some embodiments). Contacts 117 and 113 would be formed during the formation of the source/drain contacts of planar transistors of other areas. Accordingly, such processes as set forth may advantageously be compatible with other CMOS processes.

Figure 5:
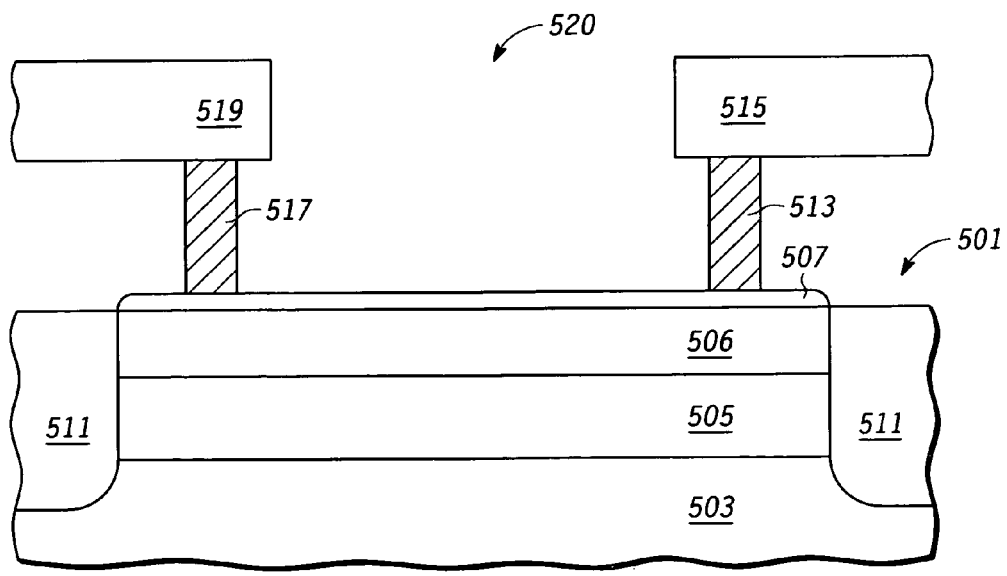
FIG. 5 is a side view of a programmable fuse according to another embodiment of the present invention.

FIG. 5 shows a side profile of another embodiment of a fuse formed on a wafer 501. Fuse 520 includes a layer of conductive programmable material that electrically couples contacts 517 and 513 together. In one embodiment silicide 507 is implemented with silicide. Contacts 517 and 513 are electrically connected to interconnects 519 and 515, respectively. Fuse 520 is similar to Fuse 120 of FIG. 3 except for an additional layer of monocrystalline silicon located between silicide 507 and silicon germanium layer 505. Silicon germanium layer 505 is located on bulk silicon material 503. Also shown in FIG. 5 is trench isolation 511.

In one embodiment, layer 506 is epitaxially grown on layer 505. In another embodiment, layer 505 is formed by the deep ion implantation of germanium into a bulk silicon substrate wherein the germanium is implanted below a top layer of the bulk silicon substrate (which becomes layer 506).

In some embodiments, layer 505 serves as a template layer to stress silicon layer 506 during its formation due to silicon germanium having a larger lattice constant than silicon. The size of the lattice constant of layer 506 conforms to the larger lattice constant of layer 505 during the epitaxial growth of layer 506. This strain on layer 506 may be used to provide better operating characteristics of transistors having their channel regions implemented therein in some embodiments. In these embodiments, the template silicon germanium layer 505 can advantageously be used as a thermal insulator. Accordingly, a fuse with a thermal insulator of silicon germanium may be implemented with only a few or no additional processing steps.

In FIG. 5, trench isolation 511 extends further into wafer 501 than layer 506 and layer 505. In one embodiment, having trench isolation 511 extend below layer 506 prevents heat from transferring laterally through layer 506 during programming.

Having trench isolation 511 extend below layer 505 may inhibit programming current from transferring to other areas of the integrated circuit via the layer.

In some embodiments, layer 505 and bulk material 503 are of different conductivity types. The difference in conductivity types between layer 505 and bulk material 503 inhibits programming current from transferring between the two layers. Accordingly, programming current is contained laterally by trench isolation 511 and vertically due to the difference in conductivity types of layer 505 and bulk material 503.

In other embodiments, layers 506 and 505 may be of different conductivity types. Accordingly, in these embodiments, programming current would be inhibited from transferring between layer 505 and layer 506. In such embodiments, trench isolation 511 would not necessarily be needed to extend below layer 505 for current isolation in that vertical current isolation could be achieved with layer 506 due to the different conductivity types of layers 505 and 506.

In some embodiments, a fuse may include other types of programmable material and/or have other configurations of programmable material. For example, in some embodiments, a fuse would not include a silicide. In some examples of such embodiments, the silicon germanium layer (e.g. 505, 105) and/or overlying silicon layer (e.g. 506) may serve as the programmable material. In such embodiments, the silicon germanium layer (e.g. 105) or the silicon layer (e.g. 506) may be more heavily doped to provide a conductive path between the contacts. Accordingly, programming would cause discontinuities in the heavily doped areas of the silicon germanium and/or silicon.

In one embodiment, a method for forming a programmable fuse includes providing a wafer including a substrate, forming a first contact structure overlying the substrate, and forming a second contact structure overlying the substrate. The first contact structure and the second contact structure are electrically coupled via programmable material located in an area of the wafer. The area of wafer includes a layer of monocrystalline silicon germanium over the substrate.

In another embodiment, an electrically programmable fuse includes a first contact structure and a second contact structure. The first contact structure and the second contact structure are electrically coupled via programmable material in a first area of a die. The first area includes a layer of monocrystalline silicon germanium located at a level underlying a level of the first contact structure and the second contact structure.

In another embodiment, a programmable fuse includes a substrate and a layer of silicon germanium overlying the substrate with no intervening dielectric material. The fuse includes a first contact structure overlying a first portion of the layer of silicon germanium without any intervening dielectric layer. A first terminal for the programmable fuse includes the first contact structure. The fuse includes a second contact structure overlying a second portion of the layer of silicon germanium. The second contact structure is electrically coupled to the first contact structure. A second terminal for the programmable fuse includes the second contact structure.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a programmable fuse comprising:
providing a wafer including a substrate of bulk semiconductor material;
forming a first contact structure overlying the substrate;
forming a second contact structure overlying the substrate;
wherein the first contact structure and the second contact structure are electrically coupled via programmable material located in an area of the wafer, the area of wafer including a layer of monocrystalline silicon germanium over the substrate;
wherein there is no intervening dielectric material between the layer of monocrystalline silicon germanium and the substrate.

2. The method of claim 1 further comprising:
forming a layer of monocrystalline silicon overlying the layer of monocrystalline silicon germanium, wherein the first contact structure and the second contact structure are formed over the layer of monocrystalline silicon.

3. The method of claim 1 wherein the programmable material includes conductive material formed from active material of the wafer.

4. The method of claim 1 further comprising:
patterning the programmable material, wherein the patterning includes patterning the layer of monocrystalline silicon germanium.

5. The method of claim 1 wherein the layer of monocrystalline silicon germanium includes monocrystalline silicon germanium carbon.

6. The method of claim 1 wherein the bulk semiconductor material includes silicon.

7. The method of claim 1 further comprising:
forming a layer of conductive material overlying the layer of monocrystalline silicon germanium of the area of the wafer, wherein the programmable material includes material of the layer of conductive material.

8. The method of claim 1 wherein the substrate has a conductivity of a first type and the layer of monocrystalline silicon germanium has a conductivity of a second type opposite the first type.

9. The method of claim 1 wherein the first contact structure and the second contact structure are formed over the layer of monocrystalline silicon germanium.

10. The method of claim 7 wherein the layer of conductive material includes silicide.

11. The method of claim 7 wherein the first contact structure and the second contact structure each electrically contact the layer of conductive material.

12. The method of claim 1 further comprising:
providing the layer of monocrystalline silicon germanium to have a first predetermined depth of the wafer; and
forming an isolation region of a second predetermined depth of the wafer adjacent peripheral edges of the layer of monocrystalline silicon germanium, the first predetermined depth being less than the second predetermined depth, wherein forming an isolation region includes etching through the layer of monocrystalline silicon germanium and etching into the substrate to the second predetermined depth.

13. A method for forming a programmable fuse comprising:
providing a wafer including a substrate of bulk semiconductor material;
forming a first contact structure overlying the substrate;
forming a second contact structure overlying the substrate;
wherein the first contact structure and the second contact structure are electrically coupled via programmable material located in an area of the wafer, the area of wafer including a layer of monocrystalline silicon germanium over the substrate;
providing the layer of monocrystalline silicon germanium to have a first predetermined depth of the wafer; and
forming an isolation region of a second predetermined depth of the wafer adjacent peripheral edges of the layer of monocrystalline silicon germanium, the first predetermined depth being less than the second predetermined depth, wherein forming an isolation region includes etching through the layer of monocrystalline silicon germanium and etching into the substrate to the second predetermined depth.

14. The method of claim 13 wherein the bulk semiconductor material includes silicon.

15. The method of claim 13 further comprising:
forming a layer of conductive material overlying the layer of monocrystalline silicon germanium of the area of the wafer, wherein the programmable material includes material of the layer of conductive material.

16. The method of claim 13 wherein the substrate has a conductivity of a first type and the layer of monocrystalline silicon germanium has a conductivity of a second type opposite the first type.

17. The method of claim 13 wherein the forming the layer of monocrystalline silicon germanium results in no intervening dielectric material between the layer of monocrystalline silicon germanium and the substrate.

18. The method of claim 13 wherein the first contact structure and the second contact structure are formed over the layer of monocrystalline silicon germanium.

19. The method of claim 13 further comprising forming a layer of monocrystalline silicon overlying the layer of monocrystalline silicon germanium, wherein the first contact structure and the second contact structure are formed over the layer of monocrystalline silicon.

20. The method of claim 15 wherein the layer of conductive material includes silicide and wherein the first contact structure and the second contact structure each electrically contact the layer of conductive material.

21. The method of claim 13 wherein the programmable material includes conductive material formed from active material of the wafer.

22. The method of claim 13 further comprising:
patterning the programmable material, wherein the patterning includes patterning the layer of monocrystalline silicon germanium.

23. The method of claim 13 wherein the layer of monocrystalline silicon germanium includes monocrystalline silicon germanium carbon.

* * * * *